(12) United States Patent
Gross

(10) Patent No.: US 10,786,982 B2
(45) Date of Patent: Sep. 29, 2020

(54) METHOD AND DEVICE FOR SEPARATING DIFFERENT MATERIAL LAYERS OF A COMPOSITE COMPONENT

(71) Applicants: Leander Kilian Gross, Langebrück (DE); Mascha Elly Gross, Langebrück (DE)

(72) Inventor: Harald Gross, Langebrück (DE)

(73) Assignees: Leander Kilian Gross, Langebrück (DE); Mascha Elly Gross, Langebrück (DE)

( * ) Notice: Subject to any disclaimer, the term of this patent is extended or adjusted under 35 U.S.C. 154(b) by 2 days.

(21) Appl. No.: 16/309,798

(22) PCT Filed: Jan. 25, 2018

(86) PCT No.: PCT/DE2018/100062
§ 371 (c)(1),
(2) Date: Dec. 13, 2018

(87) PCT Pub. No.: WO2018/137735
PCT Pub. Date: Aug. 2, 2018

(65) Prior Publication Data
US 2019/0308405 A1    Oct. 10, 2019

(30) Foreign Application Priority Data

Jan. 26, 2017 (DE) .......................... 10 2017 101 564
Apr. 20, 2017 (DE) .......................... 10 2017 108 417
Jun. 14, 2017 (WO) ................. PCT/EP2017/064614

(51) Int. Cl.
*B32B 43/00* (2006.01)
*B32B 38/10* (2006.01)
*H01L 31/048* (2014.01)

(52) U.S. Cl.
CPC ............ *B32B 43/006* (2013.01); *B32B 38/10* (2013.01); *H01L 31/048* (2013.01);
(Continued)

(58) Field of Classification Search
CPC ............ B32B 43/006; Y10T 156/1158; Y10T 156/1917; Y10S 156/93; Y10S 156/941;
(Continued)

(56) References Cited

U.S. PATENT DOCUMENTS 9,076,635 B2 *   7/2015  Gross ............... H01L 21/67115
2003/0121901 A1*  7/2003  Hata ................ H01L 21/67115
                                                     219/390
(Continued)

FOREIGN PATENT DOCUMENTS

EP        2133923 A2    12/2009

OTHER PUBLICATIONS

International Preliminary Report on Patentability and Written Opinion for PCT/DE2018/100062 dated Jul. 30, 2019.
(Continued)

*Primary Examiner* — Mark A Osele
(74) *Attorney, Agent, or Firm* — Heslin Rothenberg Farley and Mesiti PC; Nicholas Mesiti

(57) ABSTRACT

A method for separating different types of material layers of a composite component that has at least one material layer that is transparent for visible light and at least one further material layer, is provided, wherein the light from an external source falls through the at least one transparent material layer into the at least one further material layer and there is at least partially absorbed. With the help of at least one gas discharge lamp, the light-absorbing material layer is heated in less than one second to separate material layers of the composite component. A device that can be used for this method comprises at least one separation chamber and therein at least one gas discharge lamp suitable for irradiation.

17 Claims, 2 Drawing Sheets

Figure 1:
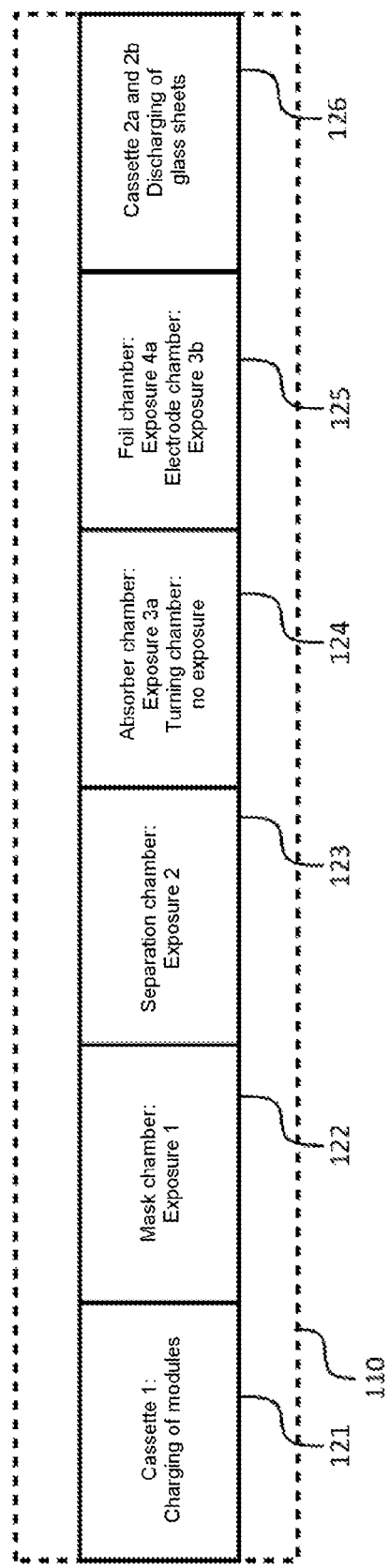

(52) U.S. Cl.
CPC ....... *B32B 2457/12* (2013.01); *B32B 2457/20* (2013.01); *Y02E 10/50* (2013.01); *Y10S 156/93* (2013.01); *Y10S 156/937* (2013.01); *Y10S 156/941* (2013.01); *Y10T 156/1158* (2015.01); *Y10T 156/1917* (2015.01)

(58) Field of Classification Search
CPC ....... Y10S 156/937; H01L 2221/68381; H01L 2221/68386
See application file for complete search history.

(56) References Cited

U.S. PATENT DOCUMENTS

| | | | |
|---|---|---|---|
| 2008/0143268 A1* | 6/2008 | Torikai | H05B 41/30 315/195 |
| 2009/0183825 A1 | 7/2009 | Sato et al. | |
| 2009/0305445 A1* | 12/2009 | Ikeda | H01L 51/0013 438/29 |
| 2011/0048641 A1* | 3/2011 | Sugimura | B32B 38/10 156/705 |
| 2011/0108108 A1 | 5/2011 | Im et al. | |
| 2016/0049325 A1* | 2/2016 | Paramio Joves | B25J 11/0095 156/247 |
| 2017/0183541 A1* | 6/2017 | Bilcai | B32B 7/12 |
| 2017/0194163 A1* | 7/2017 | Cosceev | H01L 21/324 |
| 2018/0130683 A1* | 5/2018 | Hendriks | H01L 21/6835 |
| 2019/0027461 A1* | 1/2019 | Arutinov | H01L 24/11 |

OTHER PUBLICATIONS

International Search Report issued in PCT/DE2018/100062 dated Apr. 5, 2018.

Lars Rebohle et al., "A review of thermal processing in the subsecond range: semiconductors and beyond," Semiconductor Science and Technology, IOP Publishing LTD, GB, vol. 31, No. 10, p. 103001, Sep. 1, 2016.

* cited by examiner

METHOD AND DEVICE FOR SEPARATING DIFFERENT MATERIAL LAYERS OF A COMPOSITE COMPONENT

CROSS REFERENCE TO RELATED APPLICATIONS

This application is the National Phase filing under 35 U.S.C. § 371 of International Application No. PCT/DE2018/100062, filed on Jan. 25, 2018, and published on Aug. 2, 2018 as WO 2018/137735 A1, and claims priority to German Application No. 10 2017 101 564.7, filed on Jan. 26, 2017, and to German Application No. 10 2017 108 417.7, filed on Apr. 20, 2017 and to international application PCT/EP2017/064614 filed Jun. 14, 2017. The contents of each of the prior applications are hereby incorporated by reference herein in their entirety.

The invention relates to a method for separating heterogeneous material layers of a composite component which comprises at least one material layer transparent to visible light, having a transparency of more than 40%, and at least one further material layer, where the light from an external source falls through the at least one transparent material layer into the at least one further material layer, where it is at least partly absorbed.

The invention also relates to a device for separating different material layers of composite components, this device proving especially advantageous when the composite components have a proportion by weight of glass of 50% or more. Use in the case of low weight fractions of glass is likewise possible.

Solar cell modules fall within the category of "electronic scrap" and must be recycled in accordance with EU directives. Depending on the manner of their construction, the modules contain valuable constituents such as silicon wafers and silver, or rare substances such as indium, gallium or tellurium.

Solar modules are typically ground into small constituents, after which the substances present in the granules are separated from one another by mechanical and also chemical methods. In the case of more recent methods, the entire module is heated in an oven, so that the plastics included undergo combustion. The constituents that are left over, such as glass and silicon wafers, for example, are separated mechanically from one another after the oven procedure, and are then chemically treated and cleaned, allowing them to be used again in the production process.

A thin-film solar cell module consists essentially of two glass sheets each with a thickness of approximately 2.0 to 3.0 millimeters, a laminated foil between them, made of EVA (ethylene-vinyl acetate), for example, with a thickness of approximately 0.2 to 0.4 millimeters, and also a current-generating layer having a thickness of approximately 0.003 millimeters, which is embedded between the foil and one of the two glass sheets. In terms of volume, therefore, a thin-film solar cell module consists predominantly of glass, which means that the above-described grinding and subsequent chemical separation of the materials is uneconomical as a method of recycling. Additionally, the high energy requirement of the above-described oven operation and also the associated long processing period of in some cases several hours present great motivation for the search for alternative processes of recycling.

The patent application "Recycling method for thin-film solar cell modules" (EP 2 133 923 A2) describes a method which, by scanning a laser beam over the surface of a thin-film solar cell module, heats the light-absorbing and hence current-generating layer of the module and so brings about separation of the two glass sheets. The current-generating layer can be detached subsequently in chemical baths and the EVA foil can be removed mechanically. Only the separation of the glass sheets from one another permits the chemicals to act effectively on the layers contained between the glass sheets.

The greatest drawback of the laser method for thin-film solar modules, apart from the high investment costs, is the extensive time requirement of several minutes for the scanning of the beam over the entire area of one side of the solar module, of approximately one to one and a half square meters. Assuming the nowadays customary size of a solar park with a peak power of approximately 300 megawatts, around two million thin-film solar modules are installed therein. A laser would therefore be busy for many years in breaking down the two glass sheets of the modules in the solar park.

SUMMARY OF THE INVENTION

In accordance with the current invention, a method has been developed which, by means of the light generated by at least one gas discharge lamp, carries out irradiation and heating of a light-absorbing further material layer of a composite component in an exposure field which encompasses at least a proportion of the surface of the composite component, in less than one second. By means of the gas discharge lamp or a number of them, the entire exposure field can be irradiated simultaneously, and the light-absorbing material layer heated.

In the exposure field, therefore, the material layers of the composite component are separated with utilization of suitable thermal operations or chemical operations resulting from exposure to light, or as a result of thermomechanical stresses which are a consequence of the temperature gradients or different thermal expansion coefficients of the materials, or combinations of these processes, referred to below generally as separation processes. It is sufficient in this case to heat a stratum, usually just a few micrometers thick, along the interface of the materials to be separated to the required process temperature from a starting temperature, room temperature for example, by typically several hundred degrees Kelvin. Accordingly, especially in the case of extremely thin-layer heating, it is possible to use high heating and/or cooling rates and hence irradiation times of less than one second, which can be provided with the required energy density by means of gas discharge lamps.

The irradiation times can be varied as a function of various parameters, such as the materials used in the composite component, the size of the composite component, and/or the sub-area irradiated, et cetera. Hence it is possible to use irradiation times of one millisecond, ten, twenty, fifty, a hundred, five hundred or more milliseconds, or any values in between. The skilled person is able to determine and select the optimum irradiation times for the composite component to be treated, by simulation or experiments or a combination of both, so that the energy introduced into the composite component causes a negligible increase in the temperature of the composite component as a whole.

By means of the gas discharge lamp, the light of the lamp falls through a light-transparent material layer of the composite component and is absorbed by a further material layer or two or more thereof. The separation processes triggered by the light absorption, as for example a temperature increase of several hundred degrees Kelvin, or the breaking of chemical bonds caused by exposure to the light, at or in the immediate vicinity of the interface, bring about the separation of at least two material layers of the composite component from one another. With the method described, the further material layer bordering the transparent material layer, and/or at least one of the further material layers more remote from the transparent material layer, can be separated from the adjacent material layer or layers. Because of the constant light intensity throughout the exposure field, considered at any desired moment of the exposure, homogeneous separation processes are triggered on the area in the exposure field and the resulting separation of the material layers is uniform.

The at least one gas discharge lamp may optionally be operated as a flash lamp, so that the energy introduced into the composite component leads to a negligible increase in the temperature of the composite component as a whole. The actual separation of the material layers may necessitate further method steps, described below by way of example and without limitation, which per se actually enable the separation in question or take place directly by the detachment of the interfaces from one another. The supplementary method steps may be performed separately and at a later moment.

The size of the exposure field, in other words of that proportion of the surface of the composite material that is treated with exposure to light, may be selected very differently in accordance with a variety of parameters, such as the layer construction of the composite component, the materials therein with their physical and chemical properties, the overall size of the composite component, the power density needed for the thermal process used and achievable with the light source, the space available, and other parameters. In experiments it has been shown that a field of two or more cylindrical gas discharge lamps disposed in parallel is able to provide homogeneous lighting of the entire surface of a module, and so, for example, in the case of photovoltaic modules, the glass sheets of the entire module can be separated with just one exposure and therefore within less than a second.

This method finds application, for example, in the recycling of photovoltaic modules, such as of glass sheets and layer materials of a thin-film module, displays, or "concentrated solar power" components.

The differentiation of the material layers into transparent and further, light-absorbing layers is made according to their prevailing optical behavior used for the separation process. Thus the transparent material layer forms the entry window at least for the visible light from the external radiation source into the composite component, and for this purpose has transparency for the spectral range used for the separation process employed. Material layers having transparency for visible light of more than 40% have proven suitable for the utilizable processes, with the percentages of the transparency being based on the emission spectrum of the gas discharge lamp, whose emission is generally broadband. Depending on the gas discharge lamp used, its operating parameters, on the separation process used, and also on the layer materials, the spectral transparency may include not only the visible range but also other ranges of the emission spectrum, such as light in the UV range and/or IR range, for example.

The method may also be applied to composite components whose transparent material layers have higher transparency values or transparency profiles tailored to the spectral ranges in question. The transparency may be determined through one transparent material layer or a number of them lying one above another.

The concept of the external light source or radiation source refers to a source of this kind which is not a constituent of the composite component.

According to different embodiments, the separation of the material layers may relate to the separation of two or more material layers of the composite component from one another and, through the stated processes for layer separation, may take place at various interfaces of the composite component.

Hence the at least one gas discharge lamp may be constructed and operated in such a way that UV light emitted by the lamp falls through the transparent material layer, also referred to below as first layer, and, in the further material layer bordering the first layer, this further material layer also being referred to below as second layer, the light leads to destruction of bonds and thereby entails the separation of the material layers. The UV light in this case may also penetrate one or more material layers which are transparent according to the above definition. Additionally, the UV light may pass through further material layers, which are no longer covered by the definition but which allow the passage of UV light to a sufficient extent. Such layers below are also designated as third, fourth, etc layer. In the first case, the second layer or a layer stack thereon is separated directly from the transparent material layer. In the second case, separation takes place within a layer stack of further material layers. A combination of both variants, by method steps taking place in succession, is also possible.

Analogously, separation may also take place through separation processes in different planes of the composite component. For this purpose, the at least one gas discharge lamp is constructed and operated in such a way that the visible light emitted by the lamp falls through the transparent material layer, the first layer, and is absorbed by the further material layer bordering it, the second layer, for the separation of the two layers from one another by heating.

Alternatively or additionally, the light of the gas discharge lamp falls through the first layer and heats the second layer, without separating it. Thermal conduction in the second layer heats the interface between the second layer and a third layer to such an extent that the second layer separates from the third. Depending on the thermal properties and transmission and absorption properties of the second and subsequent layers, other interfaces can also be heated in this way to the desired extent and the material layers separated from one another.

That proportion of the surface of the composite material that is treated with an exposure may be selected very differently in accordance with a variety of parameters, such as the layer construction of the composite component, the materials therein with their physical and chemical properties, the overall size of the composite component, the power density needed for the thermal process used and achievable with the light source, the space available, and other parameters. In experiments it has been shown that a field of two or more cylindrical gas discharge lamps is able to provide homogeneous lighting of the entire surface of a module, and so, for example, in the case of photovoltaic modules, the glass sheets of the entire module can be separated within less than a second. The time required in the preceding example for a solar park is therefore reduced from many years to less than a month. A further factor is that the investment costs for the field of the gas discharge lamps are only a fraction of the costs for the laser according to the prior art. Through suitable configuration of the one or more gas discharge lamps it is possible to adjust area proportions individually in percentage steps. For various applications, as for example for photovoltaic modules, displays, "concentrated solar power" plant components, et cetera, separation of their material layers has been found to be effective, in accordance with one embodiment of the method, on irradiation of a proportion of the irradiated surface of at least 5%, preferably at least 10%; higher and lower proportions, and also proportions between the values stated, are also possible.

The level of the proportion irradiated simultaneously and homogeneously may be specified by optimizing the efficiency of the method and adapting it to the particular scenario, such as material and design of the composite component, light source, etc. Here, account may be taken of the fact that the percentage area proportion of a physically induced drop in intensity at the edge of an exposure field goes down as the exposure area increases. Moreover, energy losses arising from necessary overlap of two or more small exposure fields in comparison to a larger or single exposure field, covering the entire composite component, can be reduced. Moreover, unwanted degradation because of the overlapping of the exposure fields and the associated multiple exposure of materials that have already been separated from one another can be avoided or at least reduced. The use of at least one gas discharge lamp allows the provision of the energy required for large-area exposures.

As light-absorbing material there are a variety of materials contemplated. They may consist of silicon, for example. This includes the light-absorbing material layer comprising further materials, as for example impurities or supplementary material constituents, which are present to an extent such as to ensure the light-absorbing function of the material layer for the separation process.

In the case of one exemplary, but nonlimiting, application of the method to a thin-film solar module, a first exposure is used to separate the glass sheets from one another, as two material layers of a module. Depending on the type of construction of the module, there are still different material layers present after separation on the two elements of the composite component that are now present—typically, the two glass sheets. A second exposure of the respective elements, carried out in general with a higher intensity, allows further breakdown of the material layers. For example, the current-generating layer of a thin-film solar module consists of two electrode layers such as molybdenum and a transparent conductive oxide, and also a layer in between them that absorbs the sunlight and converts it into current. The adhesion of the individual materials to one another and also their light absorption are different in magnitude, and so it is possible to separate the substances of the current-generating layer from one another without the action of chemicals. The most important step remains the separation of the glass sheets from the remaining elements, since these sheets account for the greatest proportion in terms of weight and of volume, at more than 90%. A proviso here is that electrical connections and any frames have already been removed from the module.

In the case of so-called CIGS thin-film modules, production sees the current-generating layer typically deposited on the back glass (glass on the non-sun-facing side of the module) and subsequently joined by means of the EVA foil to the front glass (glass on the sun-facing side of the module). In this case, in a first exposure, at relatively low intensity and with a period of, for example, one millisecond, the back glass can be separated from the front glass by virtue of thermomechanical stresses which come about as a result of the high temperature gradients. The maximum process temperature is generally below the evaporation temperature of the materials to be separated. In this case, the molybdenum electrode of the CIGS layer remains on the back glass, and the remaining materials of the current-generating layer including EVA foil, are attached to the front glass. After that, the molybdenum layer can be removed from the back glass by means of a second exposure at a higher intensity, but with a similar duration, again on the basis of thermomechanical stresses. The molybdenum layer removed falls in the form of particles, for example, through an air flow into a collection container on the principle of a vacuum cleaner. Alternatively the particles may fall through gravitation into a tub beneath the module. Similarly, the remaining materials of the current-generating layer may be removed from the EVA foil—which is attached on the front glass—by virtue of the temperature-induced breaking of chemical bonds, and collected as particles in a second collection container. It is therefore possible to separate molybdenum from the rest of the materials of the current-generating layer without using chemicals. On a third exposure of the front glass sheet with a duration of 500 milliseconds, for example, and with a relatively low intensity, the EVA foil is detached. The material composite of the CIGS module has therefore been broken down into two separate glass sheets, molybdenum particles, CIGS particles without molybdenum, and the EVA foil. In contrast to other recycling techniques, neither the front glass nor the back glass comes into contact with chemicals, and so there is no need either for any cleaning of the glasses prior to their further utilization. Depending on the type of construction of the composite component and the materials used therein, it is sensible to adapt the operating parameters of the gas discharge lamps in terms of exposure duration, light intensity, and number of exposures.

According to one embodiment of the method, the modules may be broken down by means of a mobile unit which, optionally divided in part into elements, is sited in a standardized freight container, also referred to generally as ISO container, freight or shipping container or sea-freight container, and employed for transport by ship, rail, and truck across borders. Such freight containers are standardized steel receptacles of large capacity that enable simple and rapid loading, conveying, storage, and unloading of goods. By means of the freight container, the mobile unit is transported to a solar park or recycling yard or to a production site for photovoltaic modules or, generally, to the location where the composite components are needed, i.e., to the location where they are operated or stored or produced, or another location at which the composite components are to be recycled. Subsequently, the glass sheet of the composite component or a plurality thereof, which may make up the predominant proportion by weight of the composite component and in comparison to the customary recycling methods contain only a few impurities after breakdown, is separated from the remaining layer materials by the method described above, and transported directly to the glass works for renewed use. The other materials, whose proportion by weight is relatively small, are transported to the corresponding recycling sites for further treatment and utilization. The mobile unit saves high costs by means of shorter transport pathways for the quantities of glass to be conveyed. In the case of a module weight of 15 kilograms, for example, the result is around 30 thousand metric tons of glass for the solar field outlined above with a maximum power of 300 megawatts. Conventional recycling plants with a throughput of material as customary in production fill entire halls, and so a mobile version cannot be realized in an ISO container.

Photovoltaic modules which generate current with the aid of silicon wafers represent the predominant proportion of all modules installed and will continue to do so for many years, simply because of the existing production capacities. These modules typically and essentially consist of a front glass and also of a virtually water-impermeable and light-impervious back foil on the non-sun-facing side of the module. In the case of more recent modules, a back glass is used instead of the water-impermeable foil. The silicon wafers are embedded, for example, with one EVA foil on each of their front and back sides, between the front glass and the back foil. With the modules that are presently the most commonly produced, the light-impervious back foil means that the back of a wafer in the module (non-sun-facing side of the wafer) cannot be directly exposed and thereby heated, with the only option thus being exposure from the front (sun-facing side). In view of the approximately around 150 to 650-fold greater thermal conductivity of silicon by comparison with glass or with polymeric foils, however, it is possible to heat the entire wafer from the front by means of exposure with a relatively long duration of 50 milliseconds, for example, in accordance with claims 4 and 5 of the invention, so that the EVA foils on front and back become detached. The energy required to achieve this is substantially higher, owing to the high heat capacity of the silicon wafers, of 150 µm to 450 µm in thickness, in comparison to an approximately 3 µm-thick current-generating layer of a thin-film solar module. The thermal conduction of the EVA foils into which the wafers are embedded, however, is substantially lower by comparison with glass. Consequently, the thermal energy in the silicon wafers during the exposure is dissipated less rapidly, in contrast to thin-layer modules. The energy requirement in the case of modules based on silicon wafers, therefore, is much lower than would be expected on the basis solely of the thickness of the light-absorbing layer.

In the case of thin-film solar modules or of wafer-based photovoltaic modules with back glass, the lifetime is increased by using what is called edge encapsulation composed, for example, of butyl rubber or silicone, with a width of approximately 10 to 15 millimeters, which is applied at the edge of the module between the glass sheets. Because, typically, the optical and thermal properties of the edge encapsulation are different from the remaining area of the module, it may in certain circumstances be desirable to divide the first exposure, for parting the glass sheets, into two exposures.

For this purpose, the module is partially masked by a shadow mask, which shades the side to be exposed apart from its edge, and after that a first exposure is carried out at a high intensity. Prior to a second exposure at a lower intensity, the shadow mask is then removed, so that the originally shaded region is also exposed and there is separation of the glass sheets. Subsequently, with a third exposure for the glass sheet in question, there may be a further breakdown at a high intensity again. If the shadow mask were omitted, the further breakdown by a third exposure might no longer be possible.

The shadow mask can be fabricated, for example, from one or more metal plates for a relatively high heat capacity with a thickness of one millimeter, adhered on a glass plate as mask support material. In the case of low exposure energies, alternatively, thinner metal templates can also be used. Other versions and materials for the shadow masks are also possible. In some cases it may be more useful to carry out a first exposure without a shadow mask, at low intensity, and then to use a shadow mask for an exposure at a high intensity.

On the basis of the construction which is similar in principle, comprising a material layer transparent to visible light and, bordering it, a light-absorbing material layer of a composite component, the methods described since can also be applied to displays. The same is also true of "concentrated solar power" components, which may be composed essentially of a mirror on a glass support and of a light-absorbing layer on a glass tube. Because of the curvature of the mirror, the sunlight is concentrated onto the glass tube, which through absorption heats a liquid that is pumped through the tube. Although the thin layer of the mirror reflects a considerable proportion of the light emitted by the gas discharge lamp, the light that is absorbed and emitted, respectively, in the UV range is sufficient to separate the thin layer from the glass support. In the case of the light-absorbing tube, conversely, even a relatively low intensity on exposure results in detachment of the light-absorbing layer.

When a laser beam in point form is scanned over the surface of a composite component, in accordance with the prior art outlined at the beginning, gas bubbles may be formed at the location of the laser beam, at the interface between the material layers to be separated. Given that a number of minutes elapse for the exposure of the entire surface of the module, the gas pressure produced locally by the beam makes only a small contribution to separating the glass sheets, especially if the gas produced during the exposure time is able to escape. In contrast to this, in the case of the invention, the sudden formation of a gas volume at the entire interface of the material layers of a module that are to be separated, in less than one second, may contribute to the separation of the layers, as is the case for a field of gas discharge lamps. Ideally, here, 100% of the interface of a module is exposed simultaneously in less than one second. In some cases, however, exposure of approximately 10% of the interface is already sufficient for the gas pressure to be utilized to separate the material layers. In the latter case, a total of approximately ten successive exposures at the same intensity and with the same exposure time would be needed in order to process the entire interface.

Where gas discharge lamps are operated at high current densities in the form, for example, of flash lamps with a current density of more than 3000 amperes per square centimeter, a considerable proportion of the light generated is emitted in the UV range. UV light is able to break bonds in plastics or heat materials which absorb light primarily in the UV range, but not in the visible range of light, such as silver mirrors, for example.

In other cases, conversely, even a small UV fraction is undesirable for the method. If, for example, visible light is intended to fall through a plastic which is transparent in this wavelength range and if a material bordering it absorbs light in the visible range, the separation of the material layers at the interface takes place by heating. UV light could give rise to damage to the plastic, meaning that the separation of the materials takes place not at the interface but instead, for example, in the middle of the plastics layer. Constructively, for example, the glass body of a gas discharge lamp may be doped with cerium, so that no UV light is emitted.

In another aspect, the invention encompasses a method for separating heterogeneous material layers of a composite component which comprises at least one material layer transparent to visible light, having a transparency of more than 40%, and at least one further material layer; wherein light from an external source falls through the at least one transparent material layer into the at least one further material layer and is at least partially absorbed; wherein the light from the external source is provided by at least one gas discharge lamp and is used to irradiate and heat the light-absorbing further material layer in an exposure field which encompasses at least a proportion of a surface of the composite component, in less than one second; wherein the radiation in the exposure field has a constant intensity at one moment of the exposure period; wherein heating of the light-absorbing further material layer causes separation of at least two material layers of the composite component from one another; and wherein the at least one material layer and at least one further material layer include at least 3 layers being stacked as a laminate comprising a top layer, an intermediate layer, and a bottom layer wherein either the top or bottom layer is separated from the remaining 2 layers in a first exposure and the intermediate layer and remaining layer are separated from each other in a second exposure.

In another aspect, the invention encompasses a method for separating heterogeneous material layers of a composite component which comprises at least one material layer transparent to visible light, having a transparency of more than 40%, and at least one further material layer; wherein light from an external source falls through the at least one transparent material layer into the at least one further material layer and is at least partially absorbed; wherein the light from the external source is provided by at least one gas discharge lamp and is used to irradiate and heat the light-absorbing further material layer in an exposure field which encompasses at least a proportion of a surface of the composite component, in less than one second; wherein the radiation in the exposure field has a constant intensity at one moment of the exposure period; wherein heating of the light-absorbing further material layer causes separation of at least two material layers of the composite component from one another; and wherein for a further breakdown of the composite component at least one of the parameters of exposure period and intensity is greater in comparison to preceding breakdowns A device for implementing one of the above methods comprises a separation chamber or two or more thereof and an external light source disposed therein, the light source being at least one gas discharge lamp which is designed for irradiating a composite component with radiation times of less than one second, in accordance with the above description. The separation chamber is a working region which is surrounded in such a way that plant components located outside the separation chamber, and the personnel, are protected from effects of the method—for example, from intense light, especially UV light, noise, evolutions of gas, or others.

Optionally it is possible for further chambers or, in one chamber, two or more sections to be arranged, with associated working units and/or joining units, which are used for supplementary steps of the method. This may relate to handling, transport, preparatory steps such as cleaning, masking, or the storage of composite components or elements thereof, or other working units. The components of the device which serve for implementing the method steps will be referred to collectively as the separation device. The separation device may be designed as a cluster plant or as an in-line plant.

The device may optionally comprise at least one standardized freight container as described above which is suitable for the use and/or for the transport of the separation device in the at least one freight container. This includes the separation device being disposed in one or more of the freight containers and the method being able to be implemented at least largely in the container, or includes the siting of the separation device, optionally disassembled, in one or more of the containers, allowing it to be transported therein to the location where it is required. The latter may include the separation device in use being disposed at least partly outside the container.

The intention below is to elucidate the invention in more detail, by way of example and without limitation, by means of an exemplary embodiment. The skilled person would combine the features realized above and below in the various embodiments of the invention in further embodiments insofar as to do so appears expedient and sensible. In the associated drawings,

BRIEF DESCRIPTION OF THE DRAWING FIGURE

Figure 2:
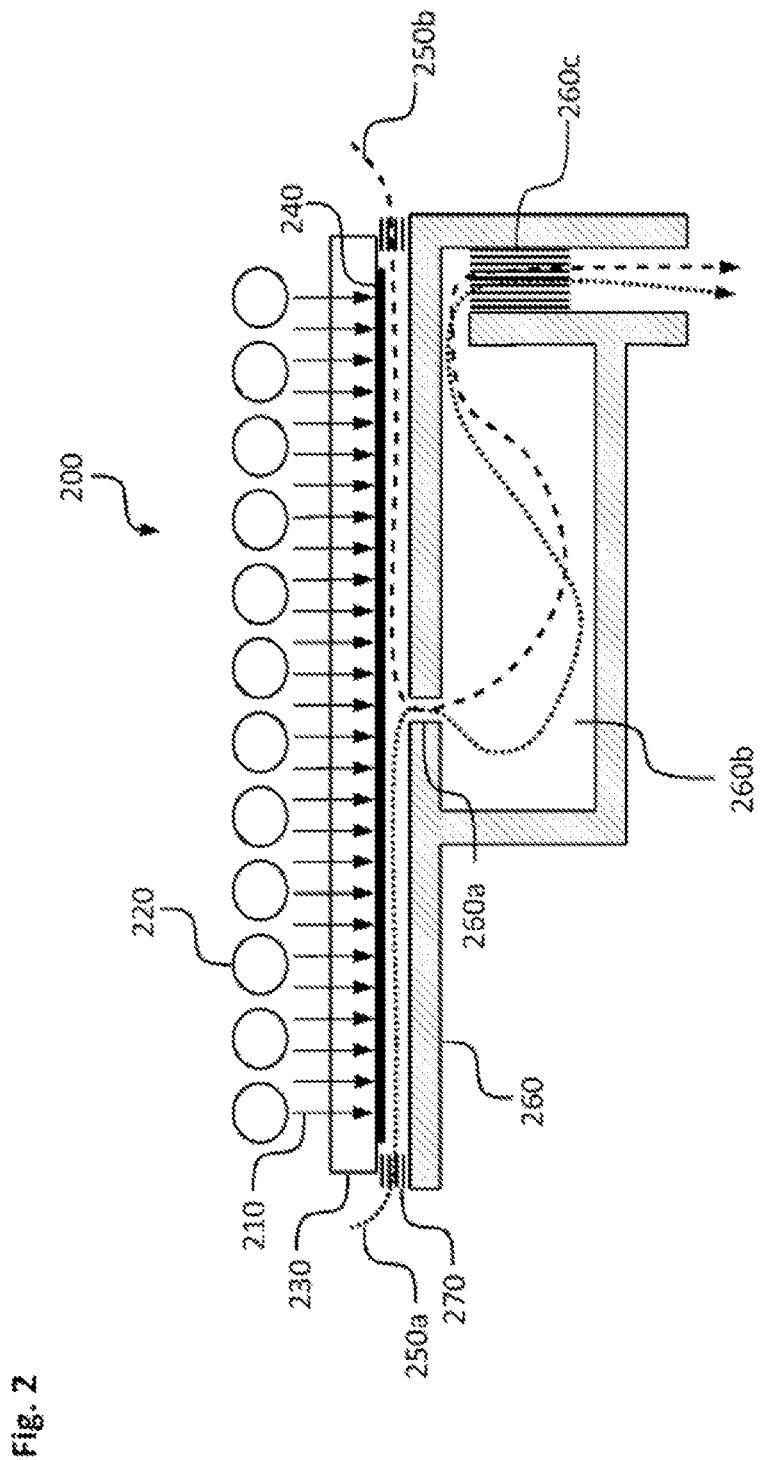

FIG. 1 shows a portable device for carrying out the method of the invention, in plan view, and FIG. 2 shows a schematic representation of the implementation of the method of the invention within an electrode chamber.

DETAILED DESCRIPTION

FIG. 1 shows in plan view an example of a portable device (100) which is sited in an ISO container (110), having a length of 40 feet. The device consists of different segments (121) to (126) with a footprint of around 2.0 m×1.5 m for, respectively, at least one process step, and locks between the segments in order to prevent light, noise, gas or dust emerging from one segment during an exposure process.

If the segments, as shown in the drawing, are arranged on the central longitudinal axis of the container, then each segment is readily accessible for maintenance or repair work even without being uninstalled from the container. In the description of the processes in the individual segments, the text below focuses on the breakdown of above-described CIGS thin-layer solar modules; there might be slight differences in some segments for other designs of composite components, referred to as module in the exemplary embodiment.

In the first segment (121) there is a cassette 1 with modules stacked horizontally and therefore parallel to the floor area, this cassette being filled outside the container before the first process step, with the front glass side of the module on the top side in relation to the ceiling of the container. From this cassette 1, a module is conveyed via a transport system, as for example a conveyor belt, into the second segment (122), of the mask chamber, and, before a first exposure, in each case a lock between the first and second segment and also a lock between the second and third segment (123) are closed in order to prevent emergence of light, noise, gas or dust from the segment (122).

A shadow mask is subsequently lowered onto the module in the segment (122), onto the front glass side, from above the module, and this mask shades off all of the regions of the module apart from the edge encapsulation during the first exposure, and the module is then exposed through the shadow mask by gas discharge lamps above the shadow mask. Following this first exposure, the lock between segment (122) and (123) is first opened, the module is thereafter transferred into the segment (123), of the separation chamber, the lock between segment (122) and (123) is closed again, and finally the module is exposed a second time, albeit now the entire top face of the front glass.

Following the second exposure, the two glass sheets of the thin-layer module are no longer joined to one another. Using suction cups, for example, the front glass is now taken off from the underlying back glass and placed subsequently into the absorber chamber of the segment (124), the front glass still bearing the EVA foil and also the current-generating layer. The back glass, including the molybdenum layer which has remained thereon, in contrast, is transported on into the turning chamber of the segment (124). The absorber chamber and the turning chamber are arranged one above the other, for example, allowing the respective glass sheets to undergo further operations in mutually separate regions of the plants.

Prior to a third exposure (exposure 3a) of the front glass in the absorber chamber, the lock between the absorber chamber of the segment (123) and the segment (124) is closed. In the turning chamber, conversely, the back glass is turned over, so that the molybdenum layer points downward. In the course of the exposure 3a, then, the current-generating layer is detached. After opening of the lock between segment (124) and segment (125), the front glass is first transported into the foil chamber, the locks are closed in a further step, and thereafter, by means of a fourth exposure (exposure 4a), the EVA layer is separated from the front glass. In the electrode chamber beneath, conversely, the molybdenum layer is now removed from the back glass by means of a third exposure (exposure 3b).

The front glass and the back glass, finally, are sorted into different cassettes 2a and 2b in the segment (126), since these glasses typically have different thicknesses and material compositions. The front glass is generally a safety glass and has a higher transparency, owing to the smaller proportion of iron, in contrast to the back glass.

FIG. 2 shows by way of example components of the chamber and the process carried out in the electrode chamber (200) of the segment (125) by means of the exposure 3a. The transport direction of the substrate or the longitudinal direction of the ISO container is perpendicular to the plane of the paper. This drawing shows a simplified cross section of the plant segment, with the gravitational force being directed downward in the plane of the paper.

A field of cylindrical flash lamps (220) in the transport direction generates light (210) which falls through the back glass (230) and is absorbed by the molybdenum layer (240). An air flow 250a and also a further air flow 250b blow the detached molybdenum particles (not shown) along in a channel which is formed by a spacing between the back glass and the section of the plant wall (260). The particles subsequently fall through an opening (260a) into a collecting container (260b), in which a major part of the particles remains. The remaining fraction of the molybdenum particles is intercepted by a dust filter (260c)—in particular, particles of very low weight—before the air flow is passed into the open. For the design of the above-described channel, spacers (270) are used which are permeable to the air flow 250a and 250b, respectively, and which ensure uniform distribution of the air flow over the entire area (240).

LIST OF REFERENCE SYMBOLS

100: Portable device
110: Outline of ISO container
121: Cassette 1
122: Mask chamber
123: Separation chamber
124: Absorber chamber and turning chamber
125: Foil chamber and electrode chamber
126: Cassette 2a and cassette 2b
200: Cross section of electrode chamber in segment (125)
210: Light beams from gas discharge lamps
220: Field of cylindrical gas discharge lamps
230: Back glass
240: Molybdenum layer on back glass (230)
250a: Air flow
250b: Air flow
260: Section of plant wall
260a: Opening in plant wall
260b: Collecting container
260c: Dust filter
270: Spacer

The invention claimed is:

1. A method for separating heterogeneous material layers of a composite component which comprises at least one material layer transparent to visible light, having a transparency of more than 40%, and at least one further material layer, wherein light from an external source falls through the at least one transparent material layer into the at least one further material layer and is at least partially absorbed, wherein the light from the external source is provided by at least one gas discharge lamp and is used to irradiate and heat the light-absorbing further material layer in an exposure field which encompasses at least a proportion of a surface of the composite component, in less than one second; wherein the radiation in the exposure field has a constant intensity at one moment of the exposure period; wherein heating of the light-absorbing further material layer causes separation of at least two material layers of the composite component from one another; and wherein the composite component is a photovoltaic module, a display or a concentrated solar power component.

2. The method as claimed in claim 1, wherein the at least one gas discharge lamp is constructed and operated in such a way that UV light emitted by the lamp falls through the transparent material layer and leads, in at least one stratum of the light-absorbing further material layer, to destruction of bonds and, thereby, to the separation of material layers in the composite system that border one another.

3. The method as claimed in claim 1, wherein the at least one gas discharge lamp is constructed and operated in such a way that visible light emitted by the lamp falls through the transparent material layer and leads to the heating of the light-absorbing further material layer and hence to the separation of material layers in the composite system that border one another.

4. The method as claimed in claim 1, wherein a further material layer is heated which borders the transparent material layer directly or with interposition of another further material layer.

5. The method as claimed in claim 1, wherein the light-absorbing material comprises silicon.

6. The method as claimed in claim 1, wherein the proportion of the irradiated surface of the composite component is at least 5% of the surface.

7. The method as claimed in claim 6, wherein the proportion of the irradiated surface of the composite component is at least 10% of the surface.

8. The method as claimed in claim 1, wherein for composite components of more than two material layers, two material layers of the composite component are separated from one another by a first exposure period at a first intensity, so that the composite component is broken down by the separation into two elements, and at least one element of the composite component is broken down further by at least one further exposure period and at least one further intensity into further elements.

9. The method as claimed in claim 8, wherein for a further breakdown of the composite component at least one of the parameters of exposure period and intensity is greater in comparison to preceding breakdowns.

10. The method as claimed in claim 9, where a first exposure is carried out without shadow mask and a further exposure with a shadow mask.

11. The method as claimed in claim 8, wherein in a first exposure, at least a part of the composite component is masked by a shadow mask and in a further exposure, without shadow mask, at least one of the parameters of exposure period and intensity is different in comparison to the first exposure with shadow mask.

12. The method as claimed in claim 11, wherein, in the first exposure, an edge encapsulation of a photovoltaic module or of a display is exposed.

13. The method as claimed in claim 1, wherein by at least one gas discharge lamp of a portable separating device, at least one material layer of a composite component is separated from the other material layers of the composite component at the location requiring the composite components, wherein the device for separating the material layers is at least partially disposed in at least one standardized freight container.

14. The method as claimed in claim 13, wherein the at least one material layer comprises a glass layer.

15. The method as claimed in claim 1 wherein a layer of a few micrometers in thickness along the interface between the transparent material layer and further material layer is heated from an initial temperature by at least hundreds of degrees Kelvin to a required temperature.

16. A method for separating heterogeneous material layers of a composite component which comprises at least one material layer transparent to visible light, having a transparency of more than 40%, and at least one further material layer; wherein light from an external source falls through the at least one transparent material layer into the at least one further material layer and is at least partially absorbed; wherein the light from the external source is provided by at least one gas discharge lamp and is used to irradiate and heat the light-absorbing further material layer in an exposure field which encompasses at least a proportion of a surface of the composite component, in less than one second; wherein the radiation in the exposure field has a constant intensity at one moment of the exposure period; wherein heating of the light-absorbing further material layer causes separation of at least two material layers of the composite component from one another; and wherein the at least one material layer and at least one further material layer include at least 3 layers being stacked as a laminate comprising a top layer, an intermediate layer, and a bottom layer wherein either the top or bottom layer is separated from the remaining 2 layers in a first exposure and the intermediate layer and remaining layer are separated from each other in a second exposure.

17. A method for separating heterogeneous material layers of a composite component which comprises at least one material layer transparent to visible light, having a transparency of more than 40%, and at least one further material layer; wherein light from an external source falls through the at least one transparent material layer into the at least one further material layer and is at least partially absorbed; wherein the light from the external source is provided by at least one gas discharge lamp and is used to irradiate and heat the light-absorbing further material layer in an exposure field which encompasses at least a proportion of a surface of the composite component, in less than one second; wherein the radiation in the exposure field has a constant intensity at one moment of the exposure period; wherein heating of the light-absorbing further material layer causes separation of at least two material layers of the composite component from one another; and wherein for a further breakdown of the composite component at least one of the parameters of exposure period and intensity is greater in comparison to preceding breakdowns.

* * * * *